United States Patent
Hsiao et al.

(10) Patent No.: US 9,741,850 B1
(45) Date of Patent: Aug. 22, 2017

(54) SEMICONDUCTOR DEVICE AND METHOD FOR FORMING THE SAME

(71) Applicant: UNITED MICROELECTRONICS CORP., Hsinchu (TW)

(72) Inventors: Shih-Yin Hsiao, Taibao (TW);
Ching-Chung Yang, Hsinchu (TW);
Ping-Hung Chiang, Hsinchu (TW);
Nien-Chung Li, Hsinchu (TW);
Wen-Fang Lee, Hsinchu (TW);
Chih-Chung Wang, Hsinchu (TW);
Kuan-Liang Liu, Zhubei (TW);
Kai-Kuen Chang, Keelung (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 15/235,320

(22) Filed: Aug. 12, 2016

(51) Int. Cl.
| | |
|---|---|
| *H01L 29/745* | (2006.01) |
| *H01L 29/76* | (2006.01) |
| *H01L 23/58* | (2006.01) |
| *H01L 21/00* | (2006.01) |
| *H01L 21/336* | (2006.01) |
| *H01L 29/78* | (2006.01) |
| *H01L 29/06* | (2006.01) |
| *H01L 21/768* | (2006.01) |
| *H01L 29/66* | (2006.01) |
| *H01L 29/423* | (2006.01) |

(52) U.S. Cl.
CPC .... *H01L 29/7835* (2013.01); *H01L 21/76895* (2013.01); *H01L 29/0653* (2013.01); *H01L 29/42364* (2013.01); *H01L 29/66492* (2013.01); *H01L 29/66545* (2013.01)

(58) Field of Classification Search
CPC . H01L 21/441; H01L 21/461; H01L 21/7624; H01L 21/8232; H01L 21/8234; H01L 29/0607; H01L 29/0611; H01L 29/42364; H01L 29/42368; H01L 29/42384; H01L 29/42388
USPC ........ 438/149, 151, 286, 289, 290; 257/213, 257/223, 229, 368, 389, 510, 629
See application file for complete search history.

(56) References Cited

U.S. PATENT DOCUMENTS

| | | | |
|---|---|---|---|
| 4,642,666 A | 2/1987 | Lidow et al. | |
| 4,907,048 A | 3/1990 | Huang | |
| 5,306,655 A * | 4/1994 | Kurimoto | H01L 21/28114 257/E21.205 |
| 5,589,411 A | 12/1996 | Yang et al. | |
| 7,381,621 B2 | 6/2008 | Lee et al. | |
| 7,531,438 B2 * | 5/2009 | Chou | H01L 21/26586 438/524 |
| 2005/0275021 A1 * | 12/2005 | Matsumoto | H01L 21/28052 257/347 |
| 2008/0166844 A1 * | 7/2008 | Rabkin | H01L 21/823418 438/257 |

(Continued)

OTHER PUBLICATIONS

Pu et al. "U.S. Appl. No. 15/136,982", filed Apr. 24, 2016, USA.

*Primary Examiner* — Hsien Ming Lee
(74) *Attorney, Agent, or Firm* — WPAT, PC

(57) ABSTRACT

A semiconductor device having a substrate, a gate electrode, a source and a drain, and a buried gate dielectric layer is disclosed. The buried gate dielectric layer is disposed below said gate electrode and protrudes therefrom to said drain, thereby separating said gate electrode and said drain by a substantial distance to reduce gate induced drain leakage.

25 Claims, 5 Drawing Sheets

(56) References Cited

U.S. PATENT DOCUMENTS

2009/0020807 A1\* 1/2009 Yoon ................. H01L 21/28167
                                                    257/327
2009/0321823 A1    12/2009 Jung
2011/0073965 A1\*  3/2011 Koh .................. H01L 21/28044
                                                    257/412
2015/0287797 A1\* 10/2015 Yu .................... H01L 29/42368
                                                    257/336

\* cited by examiner

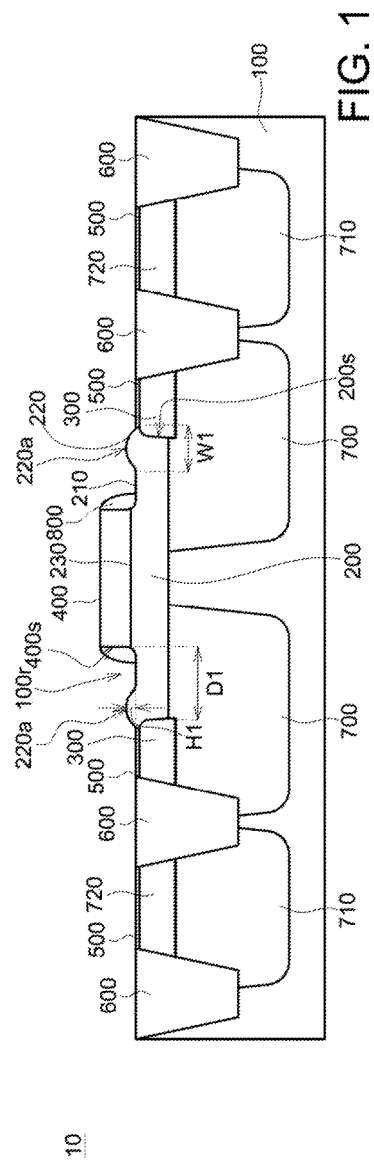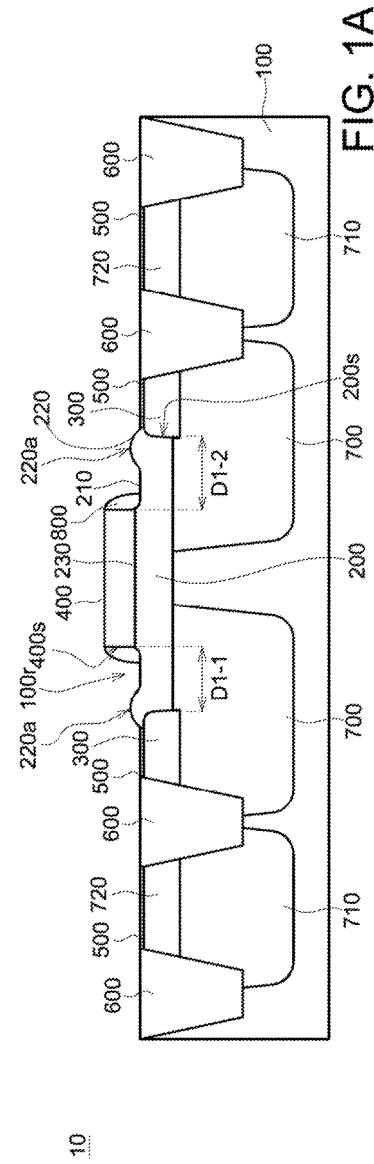

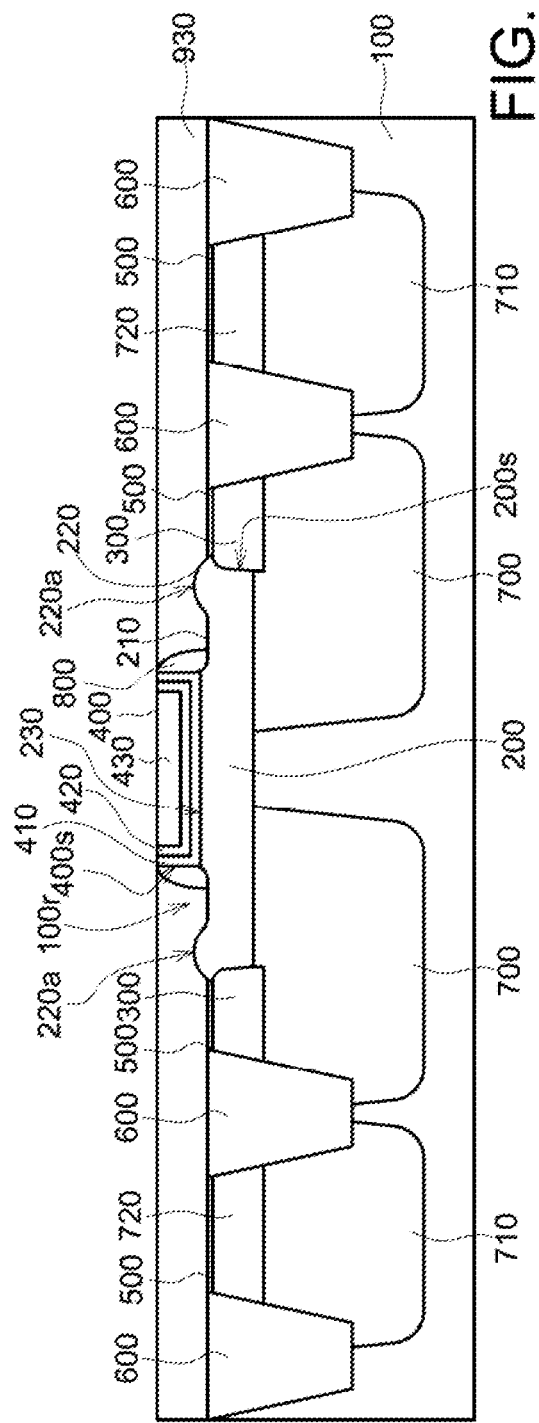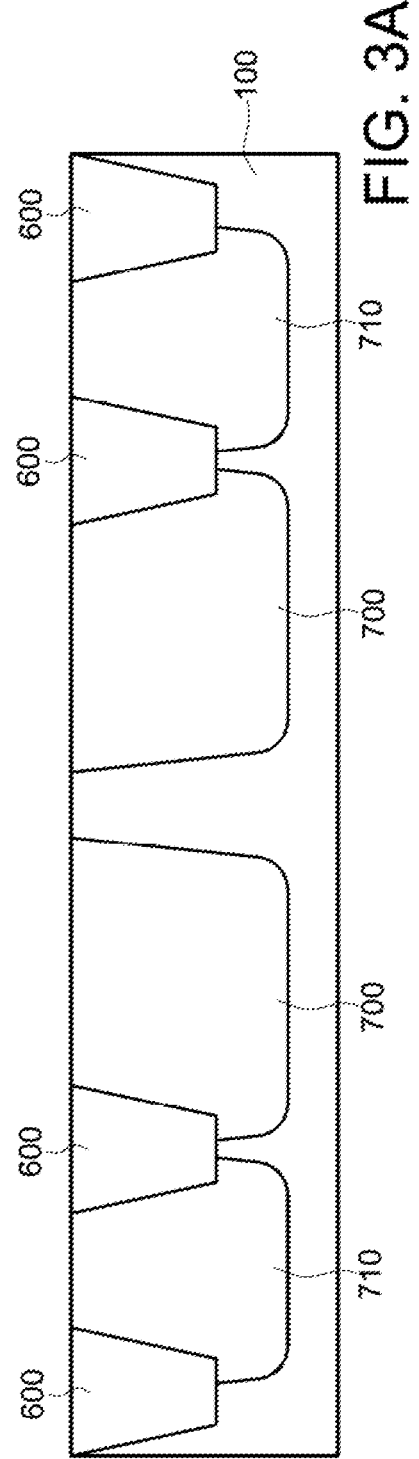

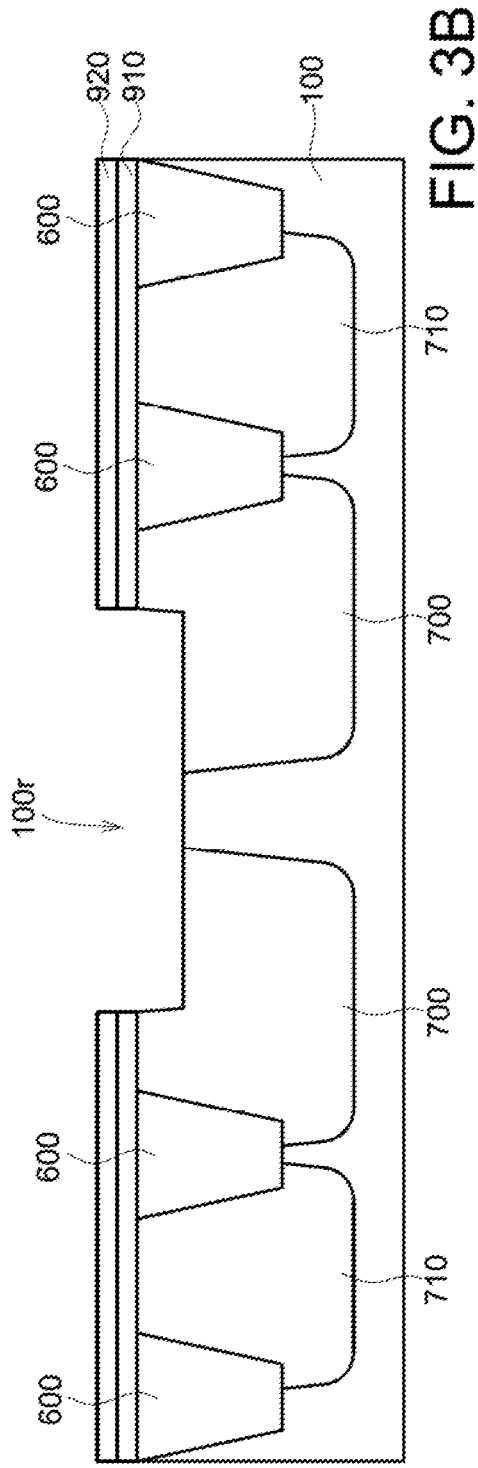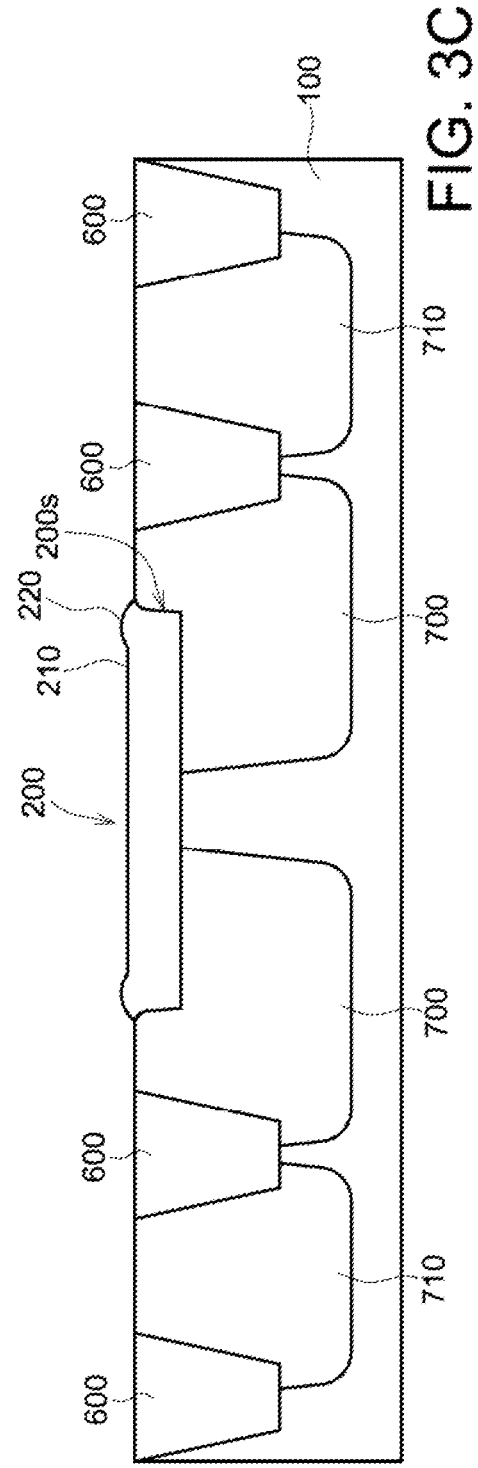

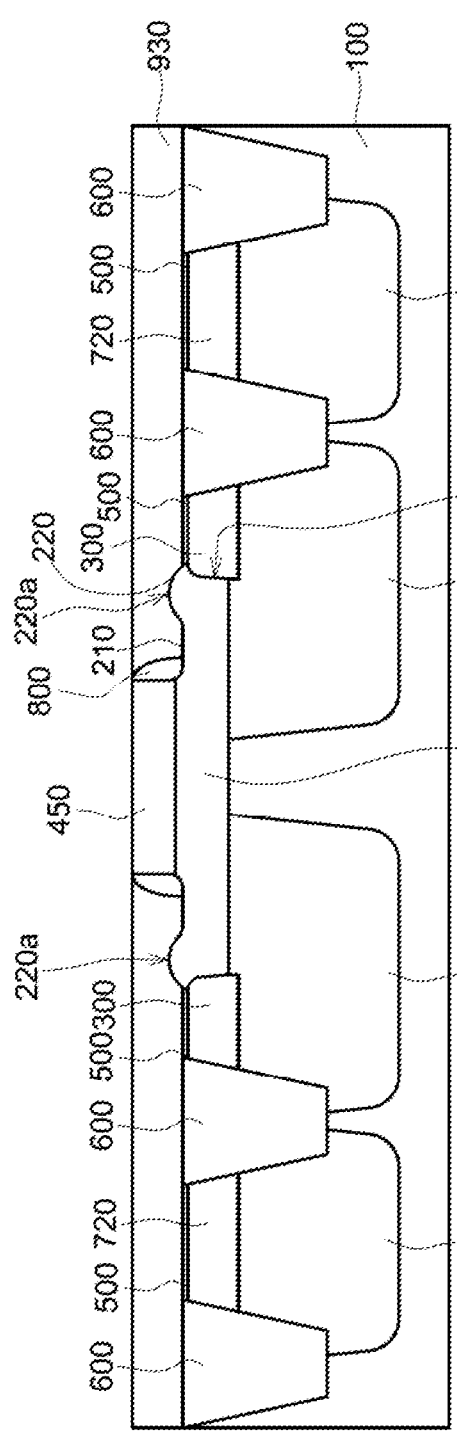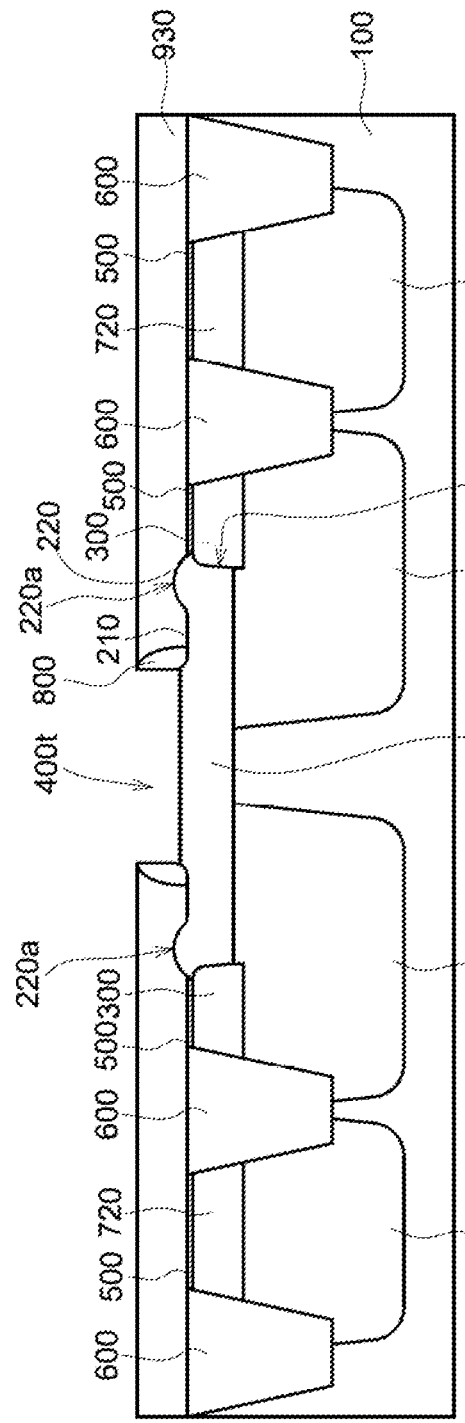

SEMICONDUCTOR DEVICE AND METHOD FOR FORMING THE SAME

TECHNICAL FIELD

The disclosure relates to a semiconductor device and a method for forming the same. More particularly, the disclosure relates to a high voltage device and a method for forming the same.

BACKGROUND

Semiconductor high voltage devices typically experience gate induced drain leakage which degrades device performance. A gate induced drain leakage is a leakage mechanism in metal oxide semiconductor (MOSFET) due to large field effect in the drain junction. Leakage commonly resulting from overstress of a semiconductor device may lead to permanent damage of the semiconductor device. Conventional solutions include changing dopant concentrations, introducing new materials, reducing manufacturing defects, and adopting different device designs.

SUMMARY

This disclosure is directed to an approach to reduce gate induced drain leakage (GIDL).

According to one aspect of the present invention, a semiconductor device having a substrate, a gate electrode, a source and a drain, and a buried gate dielectric layer is disclosed. The buried gate dielectric layer is disposed below said gate electrode and protrudes therefrom to said drain, thereby separating said gate electrode and said drain by a substantial distance to reduce gate induced drain leakage.

According to another aspect of the present invention, a method for forming a semiconductor device is disclosed. The method comprises providing a substrate, forming a recess in said substrate, forming a buried gate dielectric layer in said recess, forming a gate electrode above said substrate, and forming a source and a drain. The drain is spaced a substantial distance from said gate electrode.

BRIEF DESCRIPTION OF THE DRAWINGS

FIG. 1 shows a schematic cross-sectional view of a semiconductor device according to the best embodiment of the present invention.

FIG. 1A shows a schematic cross-sectional view of a semiconductor device according to another embodiment of the present invention.

FIG. 2 shows a schematic cross-sectional view of a semiconductor device according to yet another embodiment of the present invention.

FIGS. 3A-3E illustrate a method for forming a semiconductor device according to one embodiment of the present invention.

Figure 4A:
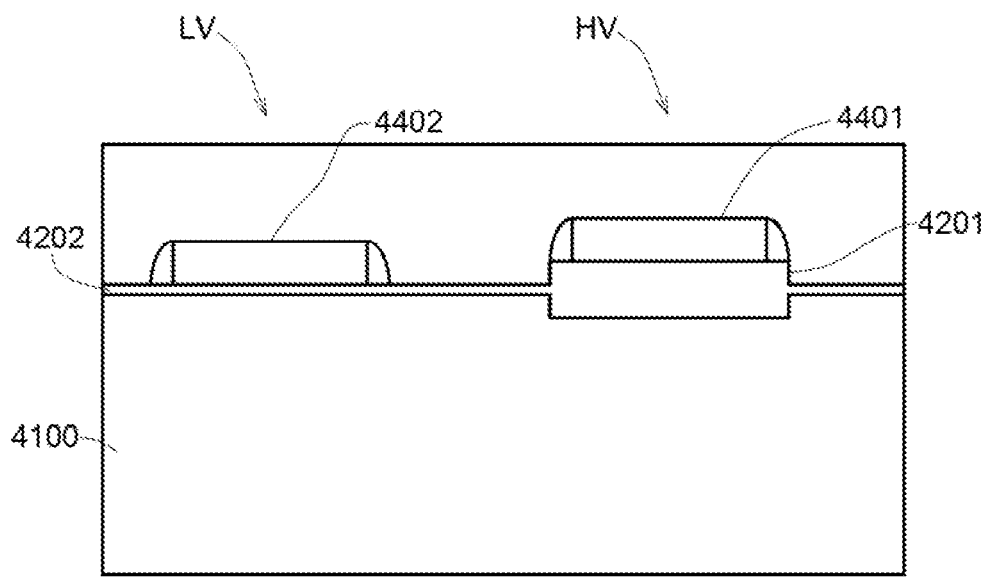
FIGS. 4A-4B schematically illustrate a traditional method for forming a semiconductor device.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Various embodiments will be described more fully hereinafter with reference to accompanying drawings. For clarity, the elements in the figures may not reflect their real sizes. Further, some components may be omitted. It is contemplated that elements and features of one embodiment may be beneficially incorporated in another embodiment without further recitation.

FIG. 1 shows a schematic cross-sectional view of a semiconductor device 10 according to one embodiment of the present invention. The semiconductor device 10 comprises a substrate 100, a buried gate dielectric layer 200, a source and a drain, both denoted by 300, and a gate electrode 400. The substrate 100 has a recess 100r in which the buried gate dielectric layer 200 is disposed. The buried gate dielectric layer 200 has a planar upper surface 210 and an edge 220 protruding beyond the planar upper surface 210 along a direction substantially perpendicular to the substrate 100. The source 300 and drain 300 are disposed at opposite sides 200s of the gate dielectric layer 200. The gate electrode 400 is disposed above the gate dielectric layer 200. The gate electrode 400 and the edge 220 of the gate dielectric layer 200 do not overlap along a direction substantially parallel to the substrate 100.

In this embodiment of the present invention, the semiconductor device 10 is a high-voltage metal oxide semiconductor device particularly a double-diffused drain (DDD) transistor. The thickness of the buried gate dielectric layer 200 is about 1000±100 Angstroms. Elements such as gate electrode, buried gate dielectric layer, source, drain, and the like of the semiconductor device 10 may be larger or smaller in size depending on the operational voltage and/or the breakdown voltage of the device. Therefore, the thickness of the buried gate dielectric layer 200 may range from hundreds of Angstroms to thousands of Angstroms.

As shown in FIG. 1, an upper surface 220a of the edge 220 is higher than the planar upper surface 210 by a step height H1 ranging from 500 to 600 Angstroms. The width W1 of the edge 220 of the buried gate dielectric layer 200 ranges from 0.12 to 0.15 microns.

As shown in FIG. 1, the semiconductor device 10 further comprises a shallow trench isolation structure 600. The shallow trench isolation structure 600 for example surrounds the gate electrode 400 and the source 300 and drain 300 in order to electrically insulate the semiconductor device 10 from other devices. As shown in FIG. 1, the source 300 and drain 300 may respectively extend from opposite sidewalls 200s of the buried gate dielectric layer 200 to the shallow trench isolation structure 600. In fact, there are many processes such as film deposition processes and thermal annealing processes performed during the formation of the semiconductor device 10, and some of these processes may diffuse dopants in the source 300 and drain 300, thereby enlarging regions of the source 300 and drain 300. Preferably, the enlarged source and drain (the enlargement not being shown) do not overlap with the gate electrode 400 along a direction substantially parallel to the substrate 100.

In this embodiment, a sidewall 400s of the gate electrode 400 is spaced a substantial distance D1 from a sidewall 200s of the buried gate dielectric layer 200. The substantial distance D1 may range from 1 to 3 microns. That is, the opposite sidewalls 400s of the gate electrode 400 are respectively spaced a substantial distance D1 from the source 300 and the drain 300.

During the formation of the semiconductor device 10, outer portions of the buried gate dielectric layer 200 not covered by the gate electrode 400 (portions corresponding to the planar upper surface 210 and edge 220) experience more wet cleaning than that of the center portion of the buried gate dielectric layer 200 covered by the gate electrode 400, causing the outer portions of the buried gate dielectric layer 200 not covered by the gate electrode 400 to experience more material loss. Depending on the level of wet cleaning experienced, the surface height decreasing caused by material loss ranges from several tens of Angstroms to 100 Angstroms. That is, the planar upper surface 210 and the edge 220 of the buried gate dielectric layer 200 not covered by the gate electrode 400 suffer more material loss while an upper surface 230 of the center portion of the buried gate dielectric layer covered by the gate electrode (interface between the buried gate dielectric layer 200 and the gate electrode 400) suffers less material loss. As a result, an upper surface 200a of the edge 220 of the buried gate dielectric layer 200 is generally higher than the upper surface 230 of the buried gate dielectric layer 200 covered by the gate electrode 400 and the upper surface 200a and the upper surface 230 are both higher than the planar upper surface 210 of the buried gate dielectric layer 200 not covered by the gate electrode 400.

According to this embodiment of the present invention, whether element 300 is a drain or a source depends on the bias of the external voltage. That on which the external voltage is applied being the source, while the other with the current flowing out therefrom being the drain. The gate electrode 400 and the drain 300 are spaced apart by a substantial distance D1. In the case where the substantial distance between the gate electrode 400 and the drain 300 is increased, the electric field generated between the gate electrode 400 and the drain 300 is decreased. Because of the weaker electric field, not only will the gate-induced drain leakage (GIDL) be decreased, and further the breakdown voltage of the semiconductor device 10 can be higher. The source 300 and drain 300 may be symmetrically disposed with respect to the gate electrode 400 as shown in FIG. 1. That is, the distance between the gate electrode 400 and the source is substantially equivalent to the distance between the gate electrode 400 and the drain.

Alternatively, the source 300 and drain 300 may be asymmetrically disposed with respect to the gate electrode 400 as shown in FIG. 1A. That is, the distance D1-1 between one of the source 300 and drain 300 and the gate electrode 400 is substantially smaller than the distance D1-2 between one of the source 300 and drain 300 and the gate electrode 400.

To improve GIDL effect, conventionally a silicide block (SAB) layer for blocking silicide formation is formed on a substrate between the gate electrode and the drain. This SAB layer is not only used to define regions to be silicided but also used as an implant mask to define drain region that is spaced a substantial distance from the gate electrode. However, a photomask for SAB layer usually has less accuracy compared to a photomask for a critical layer such as gate electrode, therefore there are lots of limitations imposed by design rule for SAB layer. For example, various substantial distances need to be maintained between the SAB layer and device elements adjacent to the SAB layer. In one specific example, the minimum dimension of the SAB layer is 0.2 micron and the minimum distance to be maintained between the SAB layer and a drain contact is 0.18 micron. These limitations imposed by design rule may expand an overall size of the semiconductor device. Furthermore, due to limitations imposed by process capacity, the predetermined source and drain regions to be implanted must be overlapped with the SAB layer by at least 0.005 microns to avoid lithography misalignment. By doing so, the GIDL effect is inevitably compromised.

In comparison, the semiconductor device 10 according to one embodiment of the present invention comprises a buried gate dielectric layer 200 horizontally protruding beyond the gate electrode 400 to form edges 220 so as to separate the gate electrode 400 from the drain 300 by a substantial distance D1, thereby improving GIDL effect without using a SAB layer. Furthermore, the sidewalls 200s of the buried gate dielectric layer 200 may also be used as an implant mask for defining source and drain regions, so a self-aligned implant process may be performed to accurately form the source and the drain. Not bound by all the limitations imposed by design rule and process capacity, the semiconductor device of the present invention may be more compact in size. Moreover, because the gate electrode 400 does not overlap with the edge 220 of the buried gate dielectric layer 200 along a direction substantially parallel to the substrate 100 and the upper surface 230 of the gate electrode 400 is substantially coplanar with the substrate surface, the planarity of the gate electrode 400 and the overall planarity of the semiconductor device 10 and other devices are not adversely affected, thereby enhancing process integration of the semiconductor device 10 and other devices such as a low voltage transistor. In the present invention, the term "low voltage" may refer to an operational voltage equivalent to or less than 5 V.

As shown in FIG. 1, the semiconductor 10 may further comprise a lightly doped source region 700 and a lightly doped drain region 700 formed in the substrate 100. The source 300 and the drain 300 are disposed in the lightly doped source region 700 and the lightly doped drain region 700 respectively. A portion of the buried gate dielectric layer 200 is disposed above the lightly doped source region 700 and the lightly doped drain region 700.

As shown in FIG. 1, the semiconductor device 10 may further comprise a heavily doped region 720 for a well pickup and a lightly doped region 710 surrounding the heavily doped region 720. For example, in a case where the drain 300 and the source 300 are N-type heavily doped regions, the lightly doped source region 700 and the lightly doped drain region 700 are N-type lightly doped regions, the heavily doped region 720 is a P-type heavily doped region, the lightly doped region 710 is a P-type lightly doped region, the substrate 100 is a P-type well receiving the doped regions stated above.

As shown in FIG. 1, the substrate 100 may further comprises a silicide layer 500 disposed on the source 300 and the drain 300 to form ohmic contact between the source 300 and the drain 300 and later-formed interconnect structures such as contact plugs. The silicide layer 500 may also be formed on the heavily doped region 720.

As shown in FIG. 1, the semiconductor device 10 may further comprise at least a spacer 800 disposed on sidewalls 400s of the gate electrode 400. The spacer 800 may have a single-layered structure of multi-layered structure. The thickness of the spacer 800 is several hundred angstroms for example 250-300 angstroms.

FIG. 2 shows a schematic cross-sectional view of a semiconductor device according to another embodiment of the present invention. The elements of this embodiment similar to the elements of the previous embodiment are represented by similar or the same numerical and are not explained in detail.

The mainly difference between the semiconductor device 20 of this embodiment and the semiconductor device 10 of the previous embodiment lies in the detailed structure of the gate electrode 400. As shown in FIG. 2, the gate electrode 400 of this embodiment may comprise a U-shaped optional barrier layer 410, a U-shaped work function metal layer 420, and a low resistivity filling metal 430. Preferably, the U-shaped optional barrier layer 410 and the U-shaped work function metal layer 420 are conformally disposed in a gate trench (not shown in FIG. but will be explained in connection with the formation of the semiconductor device 20), and the low resistivity filling metal 430 is disposed above the work function metal layer 420. A material for the U-shaped work function metal layer 420 may be chosen according to the conductive type such as N type or P type of the semiconductor device 20. In order to prevent a material of the low resistivity filling metal 430 from diffusing into the work function metal layer to affect work function of the semiconductor device 20, an optional barrier may be inserted between the U-shaped work function metal layer 420 and the low resistivity filling metal 430.

In one embodiment, the semiconductor device 20 may further comprise an interlayer dielectric layer 930. The gate electrode 400 is disposed in the interlayer dielectric layer 930 and an upper surface of the gate electrode 400 is substantially coplanar with an upper surface of the interlayer dielectric layer 930.

In one embodiment, a material for P type work function metal layer may be titanium nitride (TiN), tantalum nitride (TaN), titanium carbide (TiC), tantalum carbide (TaC), tungsten carbide (WC), or a random combination thereof. A material for N type work function metal layer may be titanium aluminum (TiAl), zirconium aluminum (ZrAl), titanium aluminum nitride (TiAlN), tungsten aluminum (WAl), tantalum aluminum (TaAl), hafnium aluminum (HfAl), or a random combination thereof.

In one embodiment, a material for the low resistivity filling metal 430 may be tungsten (W), aluminum (Al), copper (Copper), tantalum aluminum (TaAl), titanium aluminum oxide (TiAlO), or a random combination thereof. In one embodiment, a material for barrier metal layer may be a metal nitride such as titanium nitride (TiN), tantalum nitride (TaN), or a combination thereof.

In the table listed below, the semiconductor device 10 of embodiment one of the present invention is compared with two traditional semiconductor devices in view of their electrical performances. Such comparison is for illustrating the advantages of the present invention and should not be used to limit the present invention.

In Table 1, the example 1 uses a doubled diffused drain (DDD) high voltage device having a thick spacer to space gate electrode and drain apart while the example 2 uses a doubled diffused drain (DDD) high voltage device having a silicide blocking (SAB) layer to space gate electrode and drain apart. In table 1, VT represents threshold voltage, $Id_{sat}$ represents drain current, $I_{OFF}$ represents leakage current (also called off current), $I_{sub}$ represents bulk current, and BVD represents breakdown voltage.

|  | VT (V) | $I_{dsat}$ (µA/µm) | $I_{OFF}$ (pA/µm) | $I_{sub}$ (µA/µm) | BVD (V) |
| --- | --- | --- | --- | --- | --- |
| Example 1 | 0.841 | 573.2 | 204.461 | 0.96 | 16.7 |
| Example 2 | 0.837 | 560.3 | 0.169 | 1.35 | 33.1 |
| Embodiment one | 0.886 | 555.5 | 0.06 | 1.26 | 33.6 |

From table 1, one would know that the high leakage current (204.461 pA/µm) and low breakdown voltage (16.7 V) of example 1 is evidently caused by strong GIDL effect due to a short distance (several hundred angstroms) between the gate electrode and the drain. On the contrary, example 2 and the embodiment one of the present invention show very low leakage currents (less than 1 pA/µm) and high breakdown voltages (higher than 33 V) due to a long distance (more than 1 microns) between the gate electrode and the drain. Nevertheless, the semiconductor device 10 of the embodiment one of the present invention is advantageously smaller than the device used in example 2 in size.

Figure 4B:
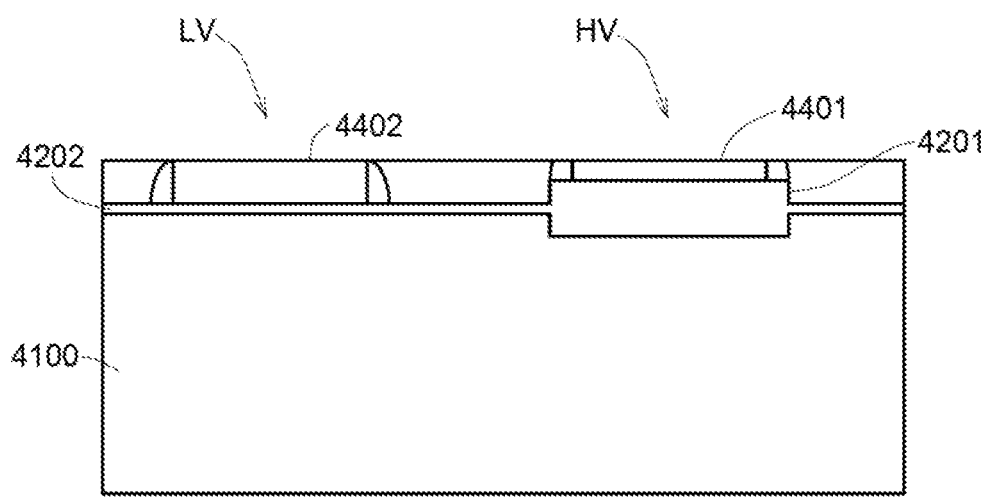

FIGS. 3A-3E illustrate a method for forming a semiconductor device according to one embodiment of the present invention. FIGS. 4A-4B schematically illustrate a traditional method for forming a semiconductor device. The elements of this embodiment similar to the elements of the previous embodiments are denoted by similar or the same numerical and are not explained in detail.

Referring to FIG. 3A, a substrate 100 is provided. In this embodiment, the substrate 100 for example is a single crystal silicon substrate, a silicon-on-insulator (SOI) substrate, or any material substrates suitable for integrated circuit manufacturing. Then, one or more implantation processes are performed to form a P-type well in the substrate 100.

As shown in FIG. 3A, then one or more shallow trench isolation structure 600 are formed to surround a gate electrode to be formed and a source and a drain to be formed. The source and drain to be formed may extend from the shallow trench isolation structure 600 to a buried gate dielectric layer to be formed. The shallow trench isolation structure 600 is adjacent to the source and drain.

As shown in FIG. 3A, then one or more implantation processes are performed to form a lightly-doped source and lightly-doped drain 700 in the substrate 100 and a lightly-doped region 710 in the substrate 100. The lightly-doped source and lightly-doped drain 700 and the lightly-doped region 710 have opposite conductive types and are separated by the shallow trench isolation structure 600. The source and drain to be formed and a portion of the buried gate dielectric layer to be formed may be formed in the lightly-doped source and lightly-doped drain 700. In this embodiment, the lightly-doped source and lightly-doped drain 700 and the lightly-doped region 710 are both formed in the P-type well in the substrate 100.

Next, a hard mask layer or a combination of the hard mask layer and an optional underlying cap oxide is blanketly formed on the substrate 100. In this embodiment, a material for the hard mask layer 920 may be silicon nitride (SiN), silicon carbide (SiC), silicon oxynitride (SiON), or the like. A material for the optional underlying cap oxide may be silicon dioxide ($SiO_2$).

Then, as shown in FIG. 3B, the hard mask layer and the optional underlying cap oxide layer are patterned by lithography and etching processes, and the substrate 100 is patterned according to the patterned hard mask layer 920 and the patterned optional underlying cap oxide layer 910 by at least one etching process especially anisotropic dry etching process to form a recess 100r in the substrate 100. According to the etching process used and etchants used in the etching process, the recess 100r may have a vertical sidewall as shown in FIG. 3B or a tapered sidewall not shown. The sidewall profile of the recess 100r affects the shape of the buried gate dielectric layer to be formed.

Next, referring to FIG. 3C, a buried gate dielectric layer 200 is formed in the recess 100r, and the patterned hard mask layer 920 and the patterned optional underlying cap oxide layer 910 are removed. In this embodiment, the buried gate dielectric layer 200 may be formed by thermal oxidizing a surface of the substrate 100 exposed by the recess 100r not covered by the patterned hard mask layer 920 and the patterned optional underlying cap oxide layer 910. The buried gate dielectric layer 200 may be formed by other ways. The buried gate dielectric layer 200 thus formed has a planar upper surface 210 and an edge 220 protruding beyond the planar upper surface 210 along a direction substantially perpendicular to the substrate 100.

As shown in FIG. 3C, the buried gate dielectric layer 200 fills in the recess 100r and has a thickness about 1000±100 angstroms. The thickness of the buried gate dielectric layer 200 substantially matches the depth of the recess 100r. In other words, the buried gate dielectric layer 200 is almost completely buried in the recess 100r.

In the traditional formation of an integrated circuit as shown in FIGS. 4A-4B, a high voltage device having thicker gate dielectric layer 4201 in a high voltage device region HV and a low voltage device having relatively thin gate dielectric layer 4202 in a logic device region LV are disposed on/in the same substrate 4100. In a case where a chemical mechanical process is performed on both the high voltage device and the low voltage device, the taller high voltage device due to thicker gate dielectric layer 4201 will suffer more material loss of the dummy gate layer than the dummy gate layer of the shorter low voltage device. As a result, as shown in FIG. 4B, after the chemical mechanical process is performed, the dummy gate electrode 4401 thus obtained of the high voltage device will have insufficient thickness to perform its designated functions while the dummy gate electrode 4402 of the low voltage device will have sufficient thickness. In comparison, the buried gate dielectric layer 200 of the present invention is almost completely buried in the substrate 100 particularly in the recess 100r, therefore it can prevent the high voltage device from becoming taller than the low voltage device, thereby avoiding substantial material loss from the gate electrode of the high voltage device after the chemical mechanical process is performed.

Next, referring to FIGS. 1 and 2, a gate electrode 400 is formed above the buried gate dielectric layer 200 and does not overlap with edges 220 of the buried gate dielectric layer 200 along a direction substantially parallel to the substrate 100. In the embodiment of FIG. 1, the gate electrode 400 for example is formed by traditional lithography and etching processes and comprises polysilicon. In the embodiment of FIG. 2, the gate electrode 400 for example is formed by a replacement metal gate method which comprises the steps explained in connection to FIGS. 3D-3E.

First, a dummy gate layer and an optional dielectric capping layer are formed above the buried gate dielectric layer 200. As shown in FIG. 3D, the dummy gate layer and the optional dielectric capping layer are patterned by lithography and etching processes to form a dummy gate electrode 450 and an optional dielectric cap (not shown in FIG. 3D). A material for the dummy gate electrode 450 may be polisilicon, amorphous silicon, single crystal silicon, or the like.

Then, as shown in FIG. 3D, at least one implantation process is performed using the buried gate dielectric layer 200 as an implantation mask to form self-aligned source 300 and drain 300 in the substrate 100 at opposite sides 200s of the buried gate dielectric layer 200. The source 300 and drain 300 thus formed extend from the shallow trench isolation structure 600 to sidewalls 200s of the buried gate dielectric layer 200. Because the buried gate dielectric layer 200 is thick enough, it serves as implantation mask for self-aligned source and drain formation to prevent dopants used in the implantation process from penetrating the buried gate dielectric layer and reaching a region under the dummy gate electrode 450.

Then, as shown in FIG. 3D, a sidewall spacer 800 are formed on sidewalls 400s of the dummy gate electrode 450. The thickness of the sidewall spacer 800 may range from 250 to 300 angstroms. The step of forming of the source 300 and drain 300 and the step of forming of the sidewall spacer 800 may be exchanged. That is, the step of forming of the source 300 and drain 300 may be performed after the step of forming of the sidewall spacer 800 is performed.

Next, as shown in FIG. 3D, a silicide layer 500 is further formed on the source 300 and drain 300. The silicide layer 500 may also be formed on the heavily-doped region 720. According to the present invention, it is not necessary to form a SAB layer on the semiconductor device to define regions for silicide formation because silicide layer is defined by exposed substrate surfaces in regions not covered/occupied by the buried gate dielectric layer 200, the shallow trench isolation structure 600, and the patterned dummy gate 450 in a self-aligning way.

Next, as shown in FIG. 3D, one or more dielectric layers are blanketly formed to cover the buried gate dielectric layer, the dummy gate electrode 450, the silicide layer 600, the shallow trench isolation structure 600, and the sidewall spacer 800. Then, a planarization process such as a chemical mechanical polishing process is performed to remove a portion of the dielectric layers so as to expose the dummy gate electrode 450 and to form a polished interlayer dielectric layer 930 with an upper surface substantially flush with an upper surface of the dummy gate electrode 450. It is noted that the dummy gate electrode 450 may suffer from material loss hence level shift of the upper surface during the chemical mechanical polishing process.

Then, referring to FIG. 3E, the dummy gate electrode 450 is removed to form a gate trench 400t by one or more wet etching processes.

At last, referring to FIG. 2, many types of material layers such as a barrier layer, a work function metal layer, an optional barrier layer, and a low resistivity metal are formed to fill in the gate trench 400t, and a chemical mechanical polishing process is performed to remove excess materials outside the gate trench 400t, thereby forming a metallic gate electrode and forming a globally planar surface across the substrate 100. The metallic gate electrode (that is the gate electrode 400 in FIG. 2) comprises the optional barrier layer 410, the work function metal layer 420, and the low resistivity metal 430. At this stage, the semiconductor device 20 shown in FIG. 2 is completed.

In summary, the semiconductor devices according to the present invention not only improves GIDL effect and enhances breakdown voltage, but also benefits from self-aligned source and drain implantation processes to have a more compact device size.

While this specification contains many specifics, these should not be construed as limitations on the scope of the invention or of what may be claimed, but rather as descriptions of features specific to particular embodiments of the invention. Certain features that are described in this specification in the context of separate embodiments can also be implemented in combination in a single embodiment. Conversely, various features that are described in the context of a single embodiment can also be implemented in multiple embodiments separately or in any appropriate suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

What is claimed is:

1. A semiconductor device, comprising:
   a substrate;
   a gate electrode;
   a source and a drain; and
   a buried gate dielectric layer disposed below said gate electrode and horizontally protruding therefrom to said drain, thereby separating said gate electrode and said drain by a substantial distance to reduce gate induced drain leakage;
   wherein an upper surface of said buried gate dielectric layer is adjacent to said gate electrode, said upper surface of said buried gate electric layer being substantially coplanar with an upper surface of said substrate in which said buried gate dielectric layer is buried.

2. The semiconductor device according to claim 1, further comprising a silicide layer disposed on said drain.

3. The semiconductor device according to claim 1, further comprising a shallow trench isolation structure adjacent to said drain.

4. The semiconductor device according to claim 1, further comprising a lightly doped drain region partially disposed below said gate electrode.

5. The semiconductor device according to claim 1, wherein said substantial distance ranges from 1 microns to 3 microns.

6. The semiconductor device according to claim 1, wherein said buried gate dielectric layer protrudes horizontally beyond sidewalls of said gate electrode by a distance ranging from 1 microns to 3 microns.

7. The semiconductor device according to claim 1, wherein said source and said drain are disposed symmetrically with respect to said gate electrode.

8. The semiconductor device according to claim 1, wherein said source and said drain are disposed asymmetrically with respect to said gate electrode.

9. The semiconductor device according to claim 1, wherein said gate electrode comprises polysilicon.

10. The semiconductor device according to claim 1, wherein said gate electrode comprises a U-shaped work function metal layer.

11. The semiconductor device according to claim 1, wherein said buried gate dielectric layer comprises a planar upper surface and an edge protruding from said planar upper surface along a direction substantially perpendicular to the substrate.

12. The semiconductor device according to claim 11, wherein an upper surface of said edge is higher than an upper surface of said substrate by a step height ranging from 500 angstroms to 600 angstroms.

13. The semiconductor device according to claim 11, wherein a width of said edge ranges from 0.12 microns to 0.15 microns.

14. The semiconductor device according to claim 11, wherein said edge does not overlap with said gate electrode along a direction substantially parallel to said substrate.

15. A method for forming a semiconductor device comprising the steps of:
   providing a substrate;
   forming a recess in said substrate;
   forming a buried gate dielectric layer in said recess;
   forming a gate electrode above said substrate; and
   forming a source and a drain, wherein said drain is spaced a substantial distance from said gate electrode;
   wherein an upper surface of said buried gate dielectric layer is adjacent to said gate electrode, said upper surface of said buried gate electric layer being substantially coplanar with an upper surface of said substrate in which said buried gate dielectric layer is buried;
   wherein said buried gate dielectric is disposed below said gate electrode and horizontally protruding therefrom to said drain.

16. The method according to claim 15, wherein said substantial distance ranges from 1 microns to 3 microns.

17. The method according to claim 15, further comprising forming a silicide layer on said drain.

18. The method according to claim 15, further comprising forming a shallow trench isolation structure adjacent to said drain.

19. The method according to claim 15, wherein forming said buried gate dielectric layer comprises oxidizing a surface of said substrate exposed by said recess.

20. The method according to claim 19, wherein said buried gate dielectric layer comprises a planar upper surface and an edge protruding from said planar upper surface along a direction substantially perpendicular to the substrate.

21. The method according to claim 20, wherein an upper surface of said edge is higher than an upper surface of said substrate by a step height ranging from 500 Angstroms to 600 Angstroms.

22. The method according to claim 20, wherein a width of said edge ranges from 0.12 microns to 0.15 microns.

23. The method according to claim 20, said edge does not overlap with said gate electrode along a direction substantially parallel to said substrate.

24. The method according to claim 15, wherein forming said gate electrode comprises:
   forming a dummy gate electrode before forming said source and said drain;
   forming a dielectric layer above said substrate to cover said dummy gate electrode;
   performing a planarization process to remove a portion of said dielectric layer so as to expose said dummy gate electrode; and
   replacing said dummy gate electrode by a metallic gate electrode.

25. The method according to claim 24, wherein said metallic gate electrode comprises a U-shaped work function metal layer.

* * * * *